United States Patent [19]

Capps, Jr. et al.

[11] 3,868,595

[45] Feb. 25, 1975

[54] RF OSCILLATOR FREQUENCY CONTROL UTILIZING SURFACE WAVE DELAY LINES

[75] Inventors: Wallace A. Capps, Jr.; Lemuel D. Groom, III; Clinton S. Hartmann; Howard G. Vollers, Jr., all of Dallas, Tex.

[73] Assignee: Texas Instruments Incorporated, Dallas, Tex.

[22] Filed: Oct. 30, 1972

[21] Appl. No.: 301,918

[52] U.S. Cl. ................ 331/108, 331/117 R, 333/72
[51] Int. Cl. .......................................... H03b 5/14
[58] Field of Search ........ 332/167; 331/108 A, 110, 331/117, 135; 333/72

[56] References Cited

UNITED STATES PATENTS

| | | | |
|---|---|---|---|
| 3,192,487 | 6/1965 | Noordanus et al. | 332/16 T |
| 3,568,102 | 3/1971 | Tseng | 331/107 A |
| 3,577,099 | 5/1971 | Hall | 331/108 |
| 3,686,592 | 8/1972 | Priebe | 333/72 |
| 3,766,496 | 10/1973 | Whitehouse | 331/107 A |

*Primary Examiner*—John Kominski
*Attorney, Agent, or Firm*—Harold Levine; Rene' E. Grossman; Alva H. Bandy

[57] ABSTRACT

A surface wave oscillator having a surface wave delay line device in its oscillator circuit is taught. The surface wave delay line device is used in the oscillator to fix the frequency of oscillation and to establish a phase slope which provides optimum frequency stability for the desired frequency modulation bandwidth.

4 Claims, 6 Drawing Figures

RF OSCILLATOR FREQUENCY CONTROL UTILIZING SURFACE WAVE DELAY LINES

Figure 4:
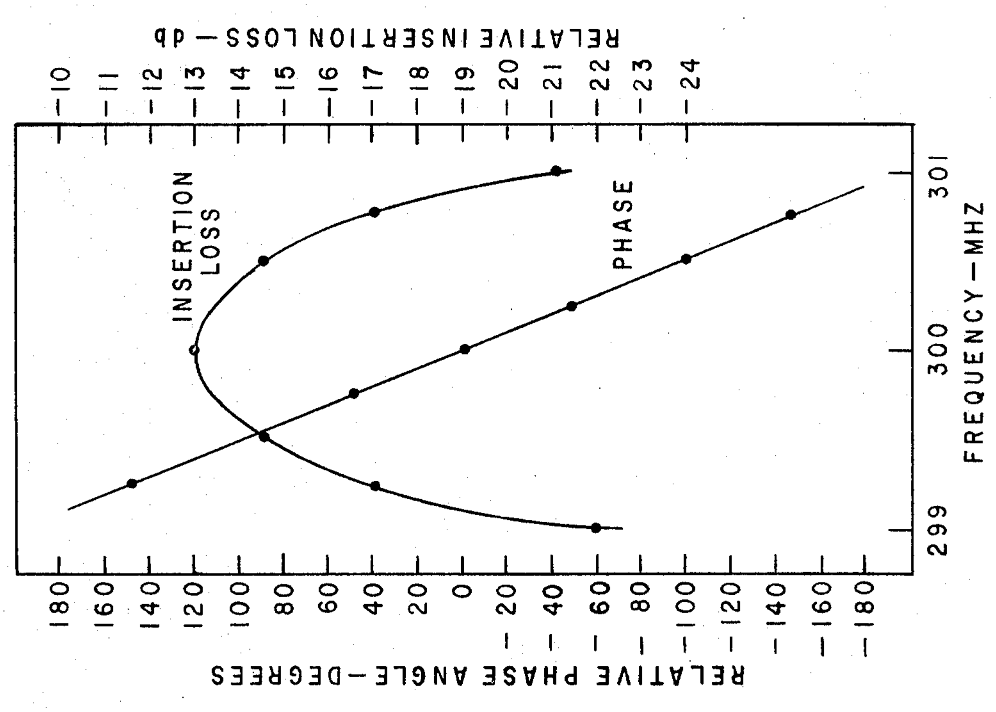

This invention relates to oscillators, and more particularly to an oscillator utilizing a surface wave device in the oscillator's circuit.

In the past, oscillators have employed resonant circuits and crystals as frequency selective devices in which it is desired that the circuit oscillate at one frequency or within a band of frequencies, and have no output at all other frequencies. In communication systems there is a requirement for frequency modulating the frequency outputs of these oscillators. However, the desire to have high frequency stability and wide frequency modulation bandwidth capability place opposing requirements on the phase characteristics of the oscillator regenerative feedback circuit. Frequency stability of an oscillator depends upon the phase slope of its feedback network. The phase slope in a L/C or quartz crystal resonator is a function of the Q of the resonator; the higher the circuit Q, the steeper the phase slope and the greater the stability. The relationship between phase slope and circuit Q for a resonant circuit may be established by evaluating the phase equation of a paralled tuned circuit which is $$\theta = \tan^{-1} ([1/\omega c] - \omega L/R) \quad (1)$$

The phase slope is obtained by differentiating equation (1):

$$(d\theta/dF) = 2\pi\,[1/1 + (1/\omega c - \omega L)^2]\,[-(1/\omega c + \omega L)/\omega R] \quad (2)$$

Evaluating at $\omega = \omega_o$:

$$(d\theta/dF) = (2\pi)\,(-2)\,\omega_o\,L/\omega_o\,R;$$

substituting $Q$ for $(\omega_o\,L/R)$ and $2\pi\,F_o$ for $\omega_o$ $(d\theta/dF) = (-\,2Q/F_o)$ (3)

Stated in terms of degrees instead of radians, the phase slope of $F_o$ is given by, $$(d\theta/dF) = (-114.6°)\,(Q/F_o) \quad (4)$$

The value of equation (4) compares with the estimated value obtained from a universal resonant curve, which reveals a rather linear phase slope over a range of ± 25°, and an average phase slope in this region equal to −100° $(Q/F_o)$.

A typical L/C oscillator may have an equivalent $Q$ on the order of 1 to 100; however, special type L/C circuits can be built with higher $Q$'s at the sacrifice of space. Extremely high $Q$'s are obtained by using crystals; a quartz crystal has $Q$'s ranging from 10,000 to 100,000 with special types reaching $Q$'s of 1,000,000. By substituting $Q$ values within these ranges and a representative communication resonant frequency in equation (4), it will be readily apparent from the flat phase slope of an L/C oscillator that it has wide frequency deviation, but its overall frequency stability is low; while from the steep phase slope of a crystal oscillator it has excellent frequency stability, but very narrow frequency deviation capability. Thus, a requirement exists for a circuit providing $Q$'s in the 100 to 10,000 range to meet the many oscillator applications confronting the communication art, and in particular the applications in the very high frequency (VHF) or ultra-high frequency (UHF) or higher frequency ranges.

A further problem exists in obtaining operative frequencies above 10 mc with crystal oscillators in that at above 10 mc, the crystal plates become so thin as to be impractical, and require the operation of crystals in their overtone modes or the use of frequency multipliers.

It has been found that a surface wave device has: a $Q$ value in the range of 100 to 10,000, frequencies which are independent of phase slope, and a configuration which will provide a practical structure for operation at frequencies above 10 mc.

Accordingly, it is an object of the invention to provide an oscillator which has a figure of merit or $Q$ intermediate the $Q$ of an L/C and crystal oscillator with good frequency stability over a given timperature range.

Another object of this invention is to provide a surface wave oscillator in which the amplitude response and phase slope of the feedback network are independent to allow optimum design for high stability and frequency deviation capability.

Yet another object of this invention is to provide an oscillator which can operate at VHF, UHF, or above without additional frequency multiplication.

A further object of the invention is to provide an oscillator which is feasible and economical to manufacture and which is rugged.

The above objects and other objects of the invention are accomplished by providing an amplifier, such as for example, a transistor amplifier with a regenerative or positive feedback circuit which includes a surface wave device, such as a surface wave delay line, to provide optimum frequency stability consistent with a desired frequency deviation or modulation capability.

Figure 1:
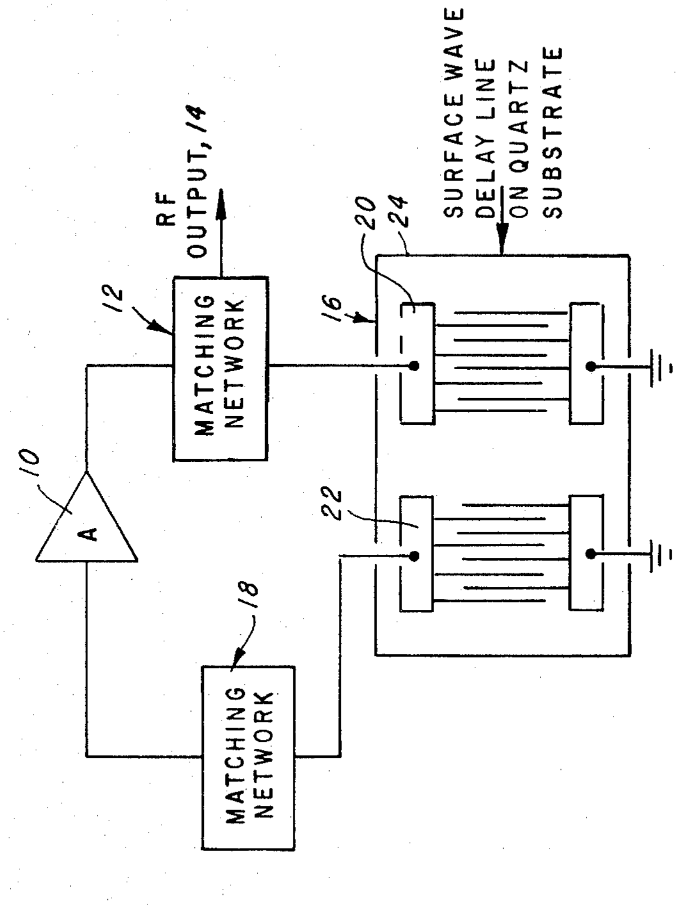
Figures 2A, 2B, 2C:
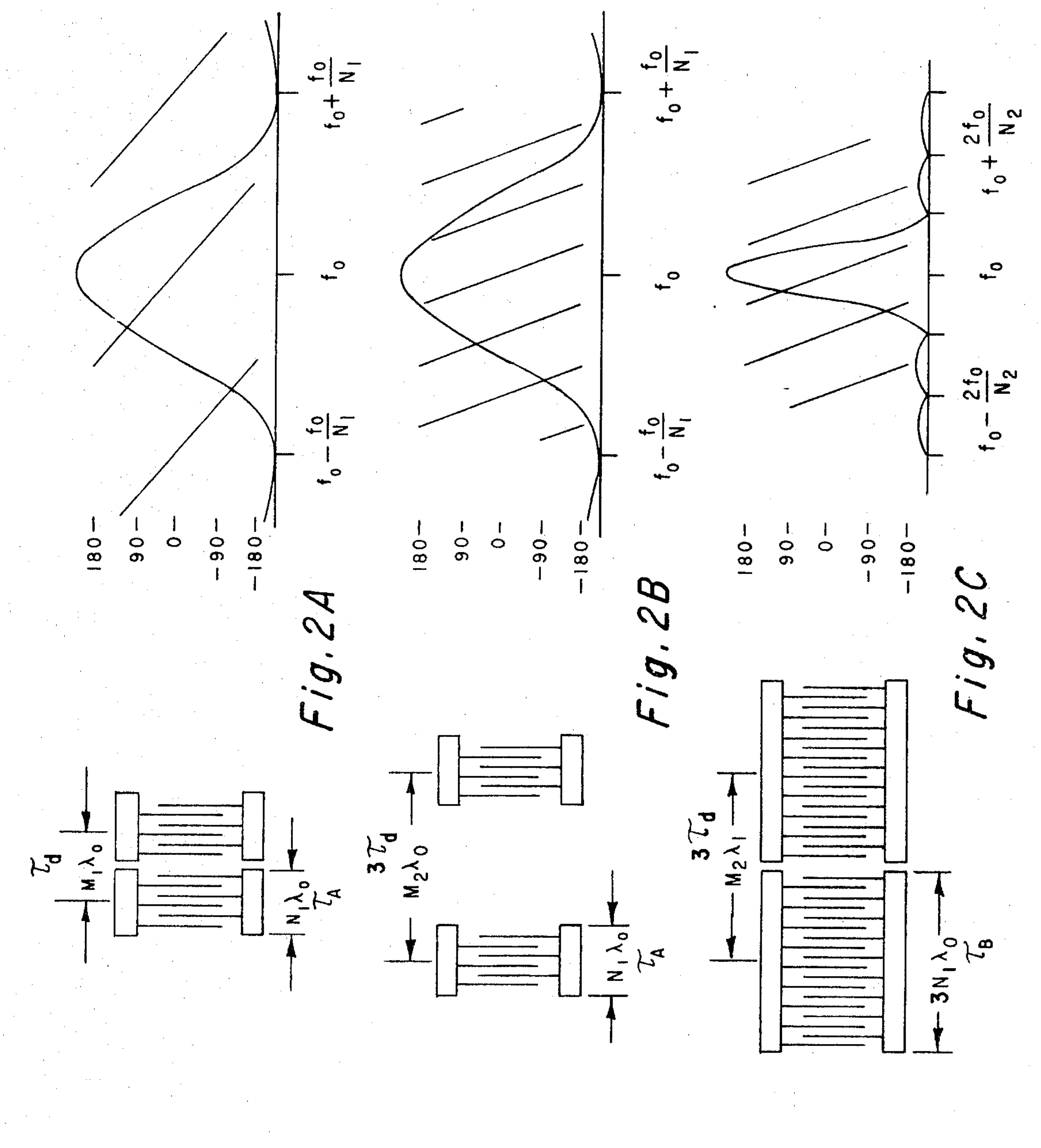
Figure 3:
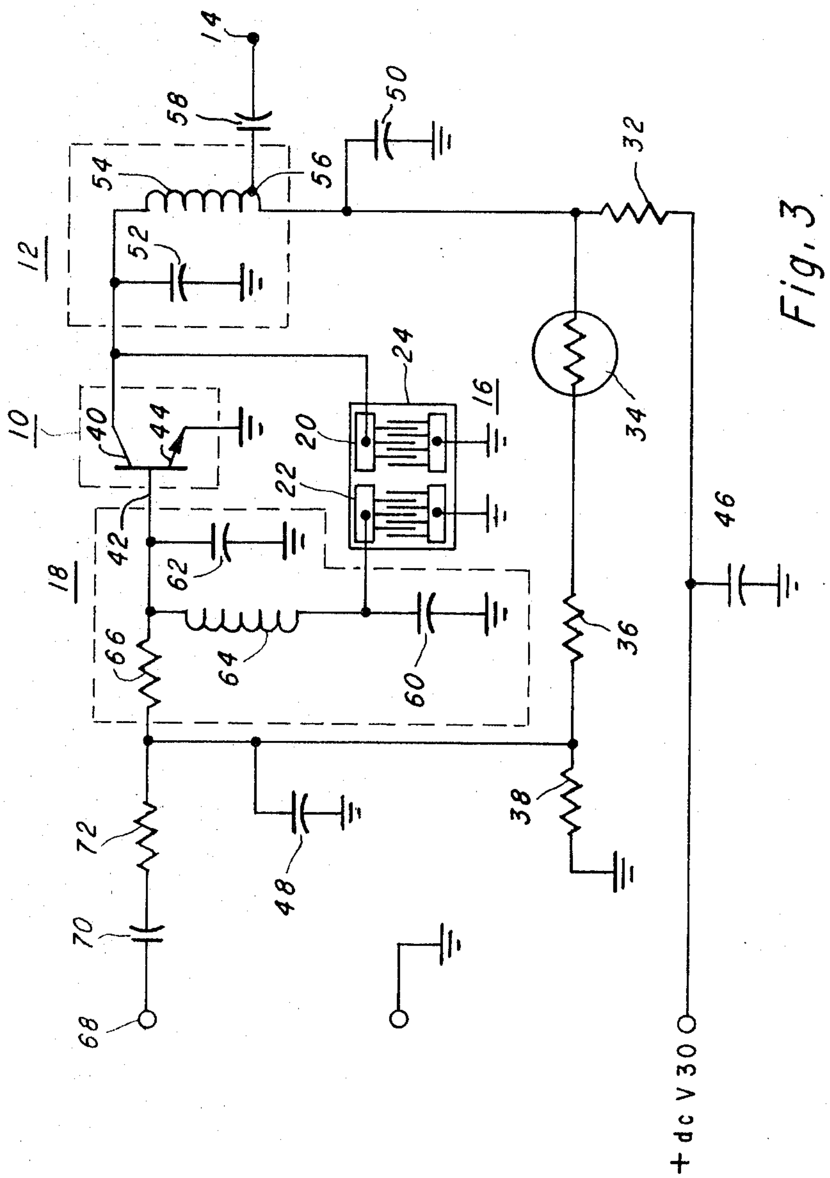

The novel features characteristic of the embodiment of the invention may best be understood by reference to the following detailed description when used in conjunction with the accompanying drawings, wherein:

FIG. 1 is a block diagram of the surface wave oscillator constituting the embodiment of the invention;

FIGS. 2A, B, and C are plan views of various arrangements of surface wave device input and output transducers on piezoelectric type substrate and their frequency and phase angle response curves;

FIG. 3 is a schematic diagram of a surface wave oscillator constituting an embodiment of the invention; and FIG. 4 is a performance graph of the surface wave device utilized in the embodiment of the invention.

Referring to the drawings in which there is shown (FIG. 1) a block diagram of a surface wave oscillator which comprises an amplifier 10 operatively coupled to an output impedance matching network 12 having an output power terminal 14 to an external load (not shown) and an output to a surface wave delay line device 16 in the regenerative or feedback loop. The output of the surface wave delay line device 16 is coupled through an input impedance matching network 18 to the input of the amplifier 10. For oscillation to occur, two basic requirements must be met: firstly, the overall loop gain must be unity, and secondly, the phase shift around the loop must be zero, or a multiple of $2\pi$.

To meet the first requirement, the amplifier is designed to have sufficient gain to overcome the losses in the feedback network, and to provide useful output power to the load. To meet the second requirement, the surface wave delay line device is designed to yield total zero degree loop phase at the operating frequency when all other phase shift elements in the feedback loop are considered. The unique ability to independently specify the amplitude response and phase slope in the surface wave delay line device allows the best compromise to be made between high stability and frequency deviation capability in the oscillator.

In order to apply modulation to the surface wave oscillator, it is necessary to vary the phase of some element in the oscillator loop. From the phase versus frequency curve of the surface wave device, it is possible to determine how much the oscillator frequency has to shift to regain the total zero degrees loop phase. For a parallel tuned circuit which might be used as a matching network for the surface wave device, the tuning network can be tuned off resonance to cause a fairly linear phase shift of up to plus or minus 30°. The surface wave device is then designed to change frequency the desired amount for plus or minus 30° phase shift on its phase slope.

As to the phase slope, in the general case of a delay line with time delay $T_d$, the phase slope is given by the equation:

$$(\Delta\theta/\Delta F) = (-360°)\ T_d. \tag{5}$$

For the specific case of the linear phase surface wave delay line, it is convenient to give the time delay in terms of the number of RF cycles, $N'$, at the operating frequency $F_o$, such that $T_d = (N'/F_o)$. Substituting this expression in equation (5)

$$(\Delta\theta/\Delta F) = (-360°)\ (N'/F_o). \tag{6}$$

From this it can be seen that for a surface wave delay line, the $Q$ can be defined by $Q = 3.6\ N'$ which means that the equivalent $Q$ for a surface wave control oscillator is directly proportional to the number of RF cycles of time delay in the line at the operating frequency. The equivalent $Q$ of the surface wave delay line can be increased by increasing the time delay of the delay line. As shown in FIG. 1, the surface wave delay line consists of a pair of interdigital electrode transducer patterns 20 and 22 deposited on a piezoelectric substrate 24. The velocity of the acoustic surface wave on the substrate material is about $10^5$ slower than the velocity of an electrode magnetic wave in free space. This velocity is used to determine acoustic wave lengths in delay lines for any particular substrate material.

The amplitude and phase response of the surface wave delay line device can be specified independently as was previously mentioned. The amplitude response is a function of the number of RF cycles or electrode pairs 26 in the individual transducer patterns. For a surface wave transducer having N number electrode pairs or cycles of RF at some frequency $F_o$, the transducer represents a rectangular impulse response envelope of RF energy at $F_o$ whose length in the time domain is $T_d = (N/F_o)$. This rectangular impulse response will have a (sin $X/X$) response in the frequency domain centered at $F_o$. The overall response of the delay line will be the product of the individual responses of the input and output transducers. If both transducers have the same number of RF cycles, the overall frequency response will be (sin $X/X)^2$. The 6 db bandwidth of this type of response is very nearly equal to $(F_o/N)$. The phase response of the delay will be linear and its slope will be a function of the time delay between the centers of the input and output transducers 20 and 22, respectively. It is convenient to express the time delay in terms of the number of RF cycles at the operating frequency separating the transducers.

FIGS. 2A, B, and C illustrate how the amplitude and phase response of a surface wave delay line device can be independently specified. In FIG. 2A there is shown two transducers of $N$ number cycles at the operating frequency whose centers are separated by a time delay $T_d = (N'/F_o) = (N/F_o)$. The 6 db bandwidth of the amplitude response is $(F_o/N)$ and the total phase change of this bandwidth calculated from the formula $(\Delta\theta/\Delta F) = (-360°)\ (N'/F_o)$ is 360°. The minimum phase slope that one can obtain at any operating frequency with transducers of N number cycles is 360° over the 6 db bandwidth of $(F_o/N)$. FIG. 2B also shows two transducers of $N$ number cycles for which the amplitude response remains the same as in the device of FIG. 2A. The time delay is now 3 times greater than in the previous device (FIG. 2A), so the phase slope is 3 times greater. In FIG. 2C the time delay and thus the phase slope remain the same as in the device of FIG. 2B, but the transducer length is increased by 3; this reduces the bandwidth of the device of FIG. 2C to one-third that of the devices of FIGS. 2A and B so there is once again a phase shift of 360° over the 6 db bandwidth. It will be noted that if a delay line configured as shown in FIG. 2B were to be used as an oscillator feedback network, oscillation could occur at several frequencies within the amplitude passband where the proper phase angle is present. This could possibly cause frequency hopping in the oscillator. The amplitude response of the delay line should be as narrow as possible for a given phase slope in order to minimize this possibility.

A surface wave oscillator constructed in accordance with the preferred embodiment of this invention is shown in FIG. 3 wherein the amplifier 10 is, for example, a NPN transistor amplifier having the usual collector, base, and emitter regions. The transistor amplifier is coupled in the common emitter configuration. It will be understood that a PNP transistor amplifier could be utilized as long as the dc polarities are reversed and other transistor configurations such as the common base and common collector configurations can be used to meet other oscillator requirements and to obtain the advantages of any particular transistor amplifier configuration. A positive dc voltage source is applied at terminal 30 to provide bias for the common-emitter configuration. Resistor 32 and sensitor 34 and resistors 36 and 38 provide the necessary bias conditions for the collector 40 and base 42, respectively. The emitter 44 is at ground potential. Capacitors 46, 48 and 50 which are coupled to ground bypass the ac signal around the biasing resistors 32, 34, 36 and 38 positive dc power source 30. The sensistor 34 provides a tempature stabilizing resistance for the dc biasing circuits. The output impedance matching network 12 comprises a L/C tuned circuit and includes a capacitor 52 whose capacitance together with the transistor 10 inherent output capacitance and the surface wave device input capacitance provides a total capacitance which is referred to the inductor 54 to match the impedance of the transistor amplifier 10 to the surface wave device 16. A tap 16 is positioned on inductor 54 to provide load impedance matching. A coupling capacitor 58 is provided for passing only ac current to the load terminal 14. The surface wave delay line device 16 utilizes two 150 wave length transducers 20 and 22 mounted upon a quartz piezoelectric element 24. The amplitude and phase response of the matched delay line are shown in FIG. 4, which shows that the phase response is linear through the passband and there is 360° of phase shift through the 6 db bandwidth which is 1.8 Mhz at 300 Mhz. As expected the external phase shift of ± 30° resulted in a deviation of ± 150 kc or 300 kc bandwidth. The construction of the surface wave delay line 16 is that of a typical surface wave device as shown and described in U.S. Pat. No. 3,581,248, issued May 25, 1971, to which reference may be had for a more detailed description. The output of the output transducer 22 of the surface wave delay line device 16 is coupled to the base 42 of transistor amplifier 10 by means of an impedance matching network 18. The impedance matching network 18 includes a capacitor 60, which includes the inherent capacitance of the output transducer 22, and a capacitor 62 whose capacitance includes the capacitance of the transistor input and an inductor 64 which together with capacitors 60 and 62 match the impedance of the surface wave delay line to the input of the transistor amplifier 10. A small ohmic value resistor 66 provides an RF load on the base 42 of the transistor amplifier 10 to stabilize the transistor from spurious oscillation. A modulating input from a source not shown is applied to terminal 68. A blocking capacitor 70 has one plate coupled to the input terminal 68 and another plate coupled to one end of a resistor 72. The other end of resistor 72 is coupled to the base 42 of the transistor amplifier 10. The blocking capacitor 70 blocks the dc voltage of the modulating input stage and the resistor 72 has a large ohmic value for setting the modulation sensitivity.

In operation, the surface wave oscillator is a self-excited circuit. When a dc current is applied to the transistor amplifier 10, any noise at the input is amplified and returned to the input through the regenerative feedback loop. The surface wave device 16 limits this noise voltage to the desired frequency and returns the noise at this frequency in the proper phase for further amplification to occur. This regenerative amplification continues until the voltage reaches its operating level at which time the surface wave device has fixed the frequency of the resulting signal. When the oscillator has reached its operating frequency, a modulating signal may be applied to the transistor amplifier 10 in any known manner. However, as is shown in FIG. 3, it is preferred to apply the modulating signal to the base of the transistor amplifier 10 to vary the phase shift through the transistor at the modulating rate. The operating characteristics of the surface wave oscillator were as follows: center frequency 300.0 Mhz; frequency modulation bandwidth ± 150 khz; frequency stability 60 khz (temperature varied from −20°C to +70°C); RF output power 2 mw; and efficiency 15%.

Although the preferred embodiment of the present invention has been described in detail, it is understood that various changes, substitutions and alterations can be made therein without departing from the scope of the invention as defined by the appended claims.

What is claimed is:

1. A phase shift oscillator including an amplifier having a phase shift network connected between its output and input ports, wherein the phase shift network is a surface wave delay line having an input transducer and an output transducer, said input and output transducers having a selected number of cycles at operating frequency and whose centers are selectively separated, said selected number of cycles at the operating frequency and separation of the input and output transducers operative to set the amplitude response and the phase response of said surface wave delay line at the peak frequency of the delay line amplitude response and appproximately equal to the frequency of zero phase shift around the oscillator loop, and wherein the selected number of cycles at the operating frequency and the separation of the input and output transducers are arranged to center the zero phase shift of the surface wave device phase line at approximately the maximum operating curve at the center of the resonance curve, and to permit a narrow resonance curve to prevent frequency hopping.

2. A phase shift oscillator including an amplifier having a phase shift network connected between its ouput and input ports wherein the phase shift network is a surface wave delay line having an input transducer and an output transducer, said input and output transducers having a selected number of cycles at operating frequency and whose centers are selectively separated, said selected number of cycles at the operating frequency and separation of the input and output transducers operative to set the amplitude response and the phase response of said surface wave delay line at the peak frequency of the delay line amplitude response and approximately equal to the frequency of zero phase shift around the oscillator loop; and a frequency modulating network coupled to the oscillator and wherein the selected number of cycles at the operating frequency and the separation of the input and output transducers are operative to center the zero phase shift of the surface wave device phase line at approximately the maximum operating curve at the center of the resonance curve to permit optimum frequency modulation of the oscillator without frequency hopping.

3. A surface wave oscillator according to claim 2, further comprising an impedance matching network operatively coupled between the amplifier and the surface wave delay line device for matching the amplifier impedance into the input of the surface wave delay line device.

4. A surface wave oscillator according to claim 3, further including an impedance matching network coupled between the output of the surface wave delay line device and the amplifier input for matching the surface wave delay line device impedance into the amplifier input.

* * * * *